US011177115B2

(12) United States Patent
Leray et al.

(10) Patent No.: US 11,177,115 B2
(45) Date of Patent: Nov. 16, 2021

(54) DUAL-LEVEL PULSE TUNING

(71) Applicant: Applied Materials, Inc., Santa Clara, CA (US)

(72) Inventors: Gary Leray, Mountain View, CA (US); Valentin N. Todorow, Palo Alto, CA (US); James Rogers, Los Gatos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 18 days.

(21) Appl. No.: 16/429,883

(22) Filed: Jun. 3, 2019

(65) Prior Publication Data

US 2020/0381214 A1  Dec. 3, 2020

(51) Int. Cl.
*H01J 37/32* (2006.01)
*H01L 21/67* (2006.01)
*H01L 21/3065* (2006.01)
*H01L 21/3213* (2006.01)

(52) U.S. Cl.
CPC .. *H01J 37/32183* (2013.01); *H01J 37/32697* (2013.01); *H01L 21/3065* (2013.01); *H01L 21/32136* (2013.01); *H01L 21/67069* (2013.01); *H01J 37/32724* (2013.01); *H01J 2237/002* (2013.01); *H01J 2237/3341* (2013.01); *H01J 2237/3343* (2013.01)

(58) Field of Classification Search
None
See application file for complete search history.

(56) References Cited

U.S. PATENT DOCUMENTS

| | | | | |
|---|---|---|---|---|
| 6,136,388 | A * | 10/2000 | Raoux | C23C 16/345 427/569 |
| 6,313,584 | B1 * | 11/2001 | Johnson | H01J 37/32082 315/111.21 |
| 8,692,467 | B2 * | 4/2014 | Benjamin | H01J 37/32137 315/111.21 |
| 8,773,019 | B2 * | 7/2014 | Coumou | H03G 1/00 315/111.21 |
| 8,933,628 | B2 * | 1/2015 | Banna | H01J 37/32174 315/111.21 |
| 8,952,765 | B2 * | 2/2015 | Fisk, II | H03F 3/20 332/149 |
| 9,190,247 | B2 * | 11/2015 | Leray | H01J 37/32935 |

(Continued)

*Primary Examiner* — Amy Cohen Johnson
*Assistant Examiner* — Srinivas Sathiraju
(74) *Attorney, Agent, or Firm* — Patterson + Sheridan, LLP

(57) ABSTRACT

Embodiments for the present application include methods and apparatus for operating a plasma enhanced substrate processing system using dual level pulsed radio frequency (RF) power. More specifically, embodiments of the present disclosure allow for frequency and power tuning in a process chamber using dual level pulsed power by using a tuning controller coupled to a matching network and/or a RF power generator. In one embodiment, a tuning system includes a tuning controller disposed in a tuning system, the tuning controller configured to tune dual level RF pulsing data from a RF power generator, wherein the tuning system is connectable to a plasma processing chamber, and a memory connecting to the tuning controller, wherein the tuning controller is configured to couple to a RF power generator and a matching network disposed in the plasma processing chamber.

20 Claims, 5 Drawing Sheets

(56) References Cited

U.S. PATENT DOCUMENTS

| | | | |
|---|---|---|---|
| 9,406,540 B2* | 8/2016 | Leray | H01L 21/6833 |
| 9,509,266 B2* | 11/2016 | Coumou | H03F 1/0233 |
| 9,595,423 B2* | 3/2017 | Leray | H01J 37/32082 |
| 9,840,776 B2* | 12/2017 | Kapoor | H01J 37/32183 |
| 9,947,514 B2* | 4/2018 | Radomski | H01J 37/321 |
| 10,102,321 B2* | 10/2018 | Povolny | G06F 30/367 |
| 10,145,010 B2* | 12/2018 | Kapoor | H01J 37/32935 |
| 10,269,540 B1* | 4/2019 | Carter | H01J 37/32192 |
| 10,468,233 B2* | 11/2019 | Kawasaki | H01J 37/32082 |
| 10,546,724 B2* | 1/2020 | Radomski | H01J 37/32183 |
| 2003/0196757 A1* | 10/2003 | Todorow | H01J 37/32183 |
| | | | 156/345.24 |
| 2009/0284156 A1* | 11/2009 | Banna | H01J 37/32174 |
| | | | 315/111.21 |
| 2013/0222055 A1* | 8/2013 | Coumou | H03F 1/0211 |
| | | | 330/75 |
| 2014/0097908 A1* | 4/2014 | Fisk, II | H03F 3/20 |
| | | | 331/15 |
| 2015/0348854 A1* | 12/2015 | Kapoor | H01J 37/32899 |
| | | | 438/10 |
| 2016/0196958 A1* | 7/2016 | Leray | H01J 37/32165 |
| | | | 315/246 |
| 2017/0018926 A1* | 1/2017 | Coumou | H01J 37/32082 |
| 2017/0054418 A1* | 2/2017 | Coumou | H03F 3/245 |
| 2017/0103873 A1* | 4/2017 | Kawasaki | H01J 37/32183 |
| 2018/0097520 A1* | 4/2018 | Wu | H03K 19/00384 |
| 2018/0115299 A1* | 4/2018 | Nagami | H01J 37/32165 |
| 2018/0163302 A1* | 6/2018 | Kapoor | H01J 37/32899 |
| 2018/0262196 A1* | 9/2018 | Wu | H03K 19/00384 |
| 2018/0294566 A1* | 10/2018 | Wang | H01J 37/32183 |

* cited by examiner

DUAL-LEVEL PULSE TUNING

BACKGROUND OF THE DISCLOSURE

Field

The embodiments herein generally relate to a semiconductor processing and more specifically, to methods and apparatus for RF power, matching and frequency tuning.

Description of the Background Art

Reliably producing submicron and smaller features is one of the key requirements of very large scale integration (VLSI) and ultra large scale integration (ULSI) of semiconductor devices. However, with the continued miniaturization of circuit technology, the dimensions of the size and pitch of circuit features, such as interconnects, have placed additional demands on processing capabilities. The multilevel interconnects that lie at the heart of this technology require precise imaging and placement of high aspect ratio features, such as vias and other interconnects. Reliable formation of these interconnects is critical to further increases in device and interconnect density. Additionally, forming sub-micron size features and interconnects with reduced waste of intermediate materials, such as resists and hardmask materials, is desired.

As feature sizes have become smaller, the demand for higher aspect ratios, defined as the ratio between the depth of the feature and the width of the feature, has steadily increased to 20:1 and even greater. Developing etch processes that are capable of reliably forming features with such high aspect ratios presents a significant challenge. Traditionally, features in a material layer having aspect ratios of about 10:1 or so were fabricated by anisotropically etching dielectric layers to a predetermined depth and width.

During a plasma process, when forming the plasma, the power from a radio frequency (RF) power source may be coupled through a dynamically tuned matching network (also referred to as a match unit) to an antenna or electrode within the processing chamber. The power is coupled from the antenna or electrode to process gases within the processing chamber to form the plasma that is used for the plasma process. The matching network ensures that the output of the RF source or bias power is efficiently converted to the plasma to maximize the amount of energy contributed to form the plasma (e.g., referred to as tuning the RF power delivery). Thus, the matching network ensures that the total impedance (i.e., plasma impedance+chamber impedance+matching network impedance) is the same as the output impedance of the RF power delivery.

In continuous wave and single level pulsing (e.g., pulsing between an on state and an off state), there is only one state to tune to (e.g., the on state). However, in dual level pulsing, the RF power source is switched between a high state and a low state at a pulse frequency and a pulse duty cycle. Thus, the RF power delivered alternates between two different on states that have to be tuned to. However, accurate tuning of the power at which the different on states provided during dual level pulsing processes at high frequency has become very challenging.

Therefore, there is a need in the art for frequency tuning in process chambers using dual level pulsed RF power.

SUMMARY

Methods for frequency tuning in process chambers using dual level pulsed RF power are provided. In one embodiment, a tuning system includes a tuning controller disposed in a tuning system, the tuning controller configured to tune dual level RF pulsing data from a RF power generator, wherein the tuning system is connectable to a plasma processing chamber, and a memory connecting to the tuning controller, wherein the tuning controller is configured to couple to a RF power generator and a matching network disposed in the plasma processing chamber.

In another embodiment, a method for tuning RF power level or frequency in a processing chamber includes providing a first and a second pulse power states at a first and a second frequencies by an RF power generator for a first period of time from a system controller disposed in a processing chamber, adjusting the first and the second frequencies to a third and fourth frequencies to achieve a desired impedance at the first and second pulse power states by a tuning controller disposed in a tuning system connected to the RF power generator, and storing the third and fourth frequencies as a last known tuned frequency at the first and second pulse power states respectively in a memory in the tuning system.

In yet another embodiment, a method for processing a substrate includes alternately providing RF energy from a RF generator disposed in a processing chamber at a first power level and a second power level by a system controller disposed in the processing chamber, wherein the RF energy provided at the first power level has a first frequency and is provided for a first period of time, wherein the RF energy provided at the second power level has a second frequency and is provided for a second period of time, tuning the first frequency of the RF energy during the first period of time and the second frequency of the RF energy during the second period of time by a tuning circuit disposed in the tuning system to reduce a reflected power of the RF energy, wherein the tuning circuit is disposed between the RF generator and a matching network disposed in the processing chamber, and storing a last known tuned value of the first frequency and the second frequency in a first memory disposed in the tuning system, when switching between power levels, setting an initial frequency of the RF energy to the last known tuned value of the first frequency or the second frequency.

BRIEF DESCRIPTION OF THE DRAWINGS

So that the manner in which the above recited features of the embodiments herein are attained and can be understood in detail, a more particular description of the disclosure, briefly summarized above, may be had by reference to the examples thereof which are illustrated in the appended drawings.

Figure 1:
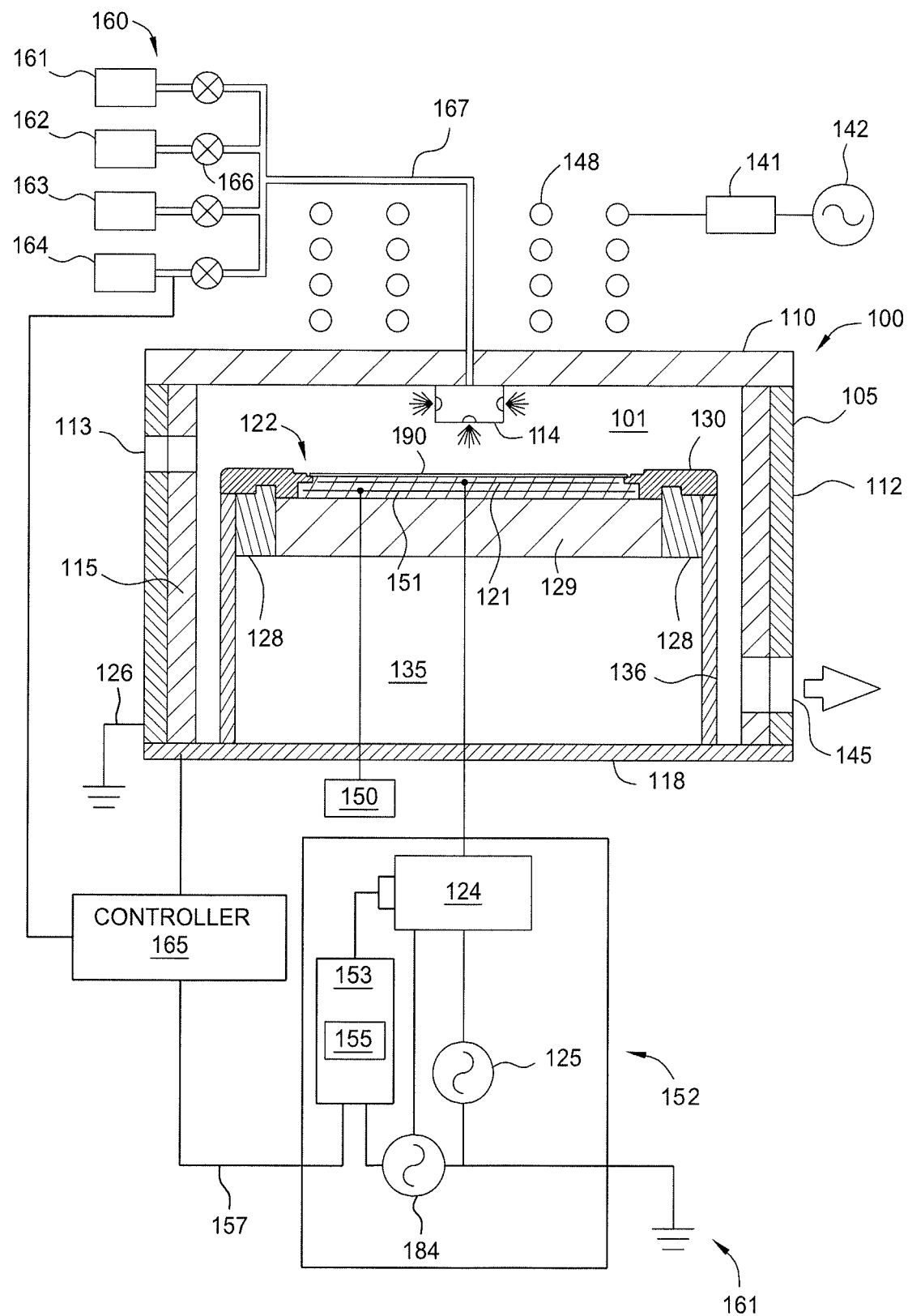
FIG. 1 depicts a processing chamber that may be utilized to tune frequency of RF power delivered to the processing chamber.

To facilitate understanding of the embodiments, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary examples and are therefore not to be considered limiting of its scope, for the invention may admit to other equally effective embodiments.

DETAILED DESCRIPTION

Embodiments for the present disclosure include methods and apparatus for operating a plasma enhanced substrate processing system using dual level pulsed radio frequency (RF) power generators. More specifically, embodiments of the present disclosure allow for matching, frequency and power tuning in a process chamber using dual level pulsed powers by using a tuning controller coupled to a matching network and a RF power generator. The tuning controller may be coupled internally or externally to the processing chamber. In some embodiments, the methods may advantageously provide methods for frequency and/or power and/or matching tuning between two plasma-on states. The tuning controller coupled to the matching network and/or the RF power generators may tune, vary or respond the matching level, frequency level or power level as detected in the processing chamber in a timely fashion so as to adjust the impedance of the electrical pathway seen by the RF source (i.e., plasma impedance and/or chamber impedance and/or matching network impedance) in order to minimize power reflected back to the RF power source from the plasma and maximize efficient coupling of power from the RF power source to the plasma.

FIG. 1 is a simplified cutaway view for an exemplary processing chamber 100 for performing a patterning/etching process to etch a material layer on a substrate using an etching process. The exemplary processing chamber 100 is suitable for removing one or more film layers from the substrate 190. One example of the process chamber that may be adapted to benefit from the invention is a Sym3® processing chamber, available from Applied Materials, Inc., located in Santa Clara, Calif. It is contemplated that other process chambers, including those from other manufactures, may be adapted to practice embodiments of the invention.

The processing chamber 100 includes a chamber body 105 having a chamber volume 101 defined therein. The chamber body 105 has sidewalls 112 and a bottom 118 which are coupled to ground 126. The sidewalls 112 have a liner 115 to protect the sidewalls 112 and extend the time between maintenance cycles of the processing chamber 100. The dimensions of the chamber body 105 and related components of the processing chamber 100 are not limited and generally are proportionally larger than the size of the substrate 190 to be processed therein. Examples of substrate sizes include 150 mm diameter, 200 mm diameter, 300 mm diameter and 450 mm diameter, among others.

The chamber body 105 supports a chamber lid assembly 110 to enclose the chamber volume 101. The chamber body 105 may be fabricated from aluminum or other suitable materials. A substrate access port 113 is formed through the sidewalls 112 of the chamber body 105, facilitating the transfer of the substrate 190 into and out of the processing chamber 100. The substrate access port 113 may be coupled to a transfer chamber and/or other chambers of a substrate processing system (not shown).

A pumping port 145 is formed through the sidewalls 112 of the chamber body 105 and connected to the chamber volume 101. A pumping device (not shown) is coupled through the pumping port 145 to the chamber volume 101 to evacuate and control the pressure therein. The pumping device may include one or more pumps and throttle valves.

A gas panel 160 is coupled by a gas line 167 to the chamber body 105 to supply process gases into the chamber volume 101. The gas panel 160 may include one or more process gas sources 161, 162, 163, 164 and may additionally include inert gases, non-reactive gases, and reactive gases, if desired. Examples of process gases that may be provided by the gas panel 160 include, but are not limited to, hydrocarbon containing gas including methane ($CH_4$), sulfur hexafluoride ($SF_6$), carbon tetrafluoride ($CF_4$), hydrogen bromide (HBr), hydrocarbon containing gas, argon gas (Ar), chlorine ($Cl_2$), nitrogen (N2), and oxygen gas ($O_2$). Additionally, process gasses may include chlorine, fluorine, oxygen and hydrogen containing gases such as $BCl_3$, $C_4F_8$, $C_4F_6$, $CHF_3$, $CH_2F_2$, $CH_3F$, $NF_3$, $CO_2$, $SO_2$, CO, and $H_2$ among others.

Valves 166 control the flow of the process gases from the sources 161, 162, 163, 164 from the gas panel 360 and are managed by a controller 165. The flow of the gases supplied to the chamber body 105 from the gas panel 160 may include combinations of the gases.

The lid assembly 110 may include a nozzle 114. The nozzle 114 has one or more ports for introducing the process gases from the sources 161, 162, 164, 163 of the gas panel 160 into the chamber volume 101. After the process gases are introduced into the processing chamber 100, the gases are energized to form plasma. An antenna 148, such as one or more inductor coils, may be provided adjacent to the processing chamber 100. An antenna power supply generator 142 may power the antenna 148 through a match circuit 141 to inductively couple energy, such as RF energy, to the process gas to maintain a plasma formed from the process gas in the chamber volume 101 of the processing chamber 100. Alternatively, or in addition to the antenna power supply 142, process electrodes below the substrate 190 and/or above the substrate 190 may be used to capacitively couple RF power to the process gases to maintain the plasma within the chamber volume 101. The operation of the antenna power supply generator 142 may be controlled by a controller, such as controller 165, which also controls the operation of other components in the processing chamber 100.

A substrate support pedestal 135 is disposed in the chamber volume 101 to support the substrate 190 during processing. The substrate support pedestal 135 may include an electro-static chuck 122 for holding the substrate 190 during processing. The electro-static chuck (ESC) 122 uses the electro-static attraction to hold the substrate 190 to the substrate support pedestal 135. The ESC 122 is powered by an RF power supply generator 125 integrated with a matching network 124. The ESC 122 comprises an electrode 121 embedded within a dielectric body. The electrode 121 is coupled to a plurality of RF power bias power source generators 184, 125. The RF bias power source generators 184, 125 are coupled to the electrode 121 disposed in the electro-static chuck (ESC) 122 and another electrode, such as the showerhead assembly or ceiling (lid assembly 110) of the chamber body 105 as needed. The RF bias power from the RF bias power source generators 184, 125 excites and sustains a plasma discharge formed from the gases disposed in the processing region of the chamber body 105.

In the example depicted in FIG. 1, the dual RF power generators 184, 125 are coupled to the electrode 121 disposed in the electro-static chuck (ESC) 122 through a matching network 124. The signal generated by the RF power generators 184, 125 is delivered through matching network 124 to the electro-static chuck (ESC) 122 through a single feed to ionize the gas mixture provided in the plasma processing chamber 100, thus providing ion energy necessary for performing an etch deposition or other plasma enhanced process.

A tuning system 152 is coupled to the RF power generators 184, 125 and the matching network 124 to tune the frequency, power level and matching level from the matching network 124 and the RF power generators 184, 125. The tuning system 152 includes a tuning controller 153 and a memory 155 that is capable storing the last known tuned frequencies or powers of a high power level state and/or a lower power level state (e.g., or at least dual states). The last known tuned frequencies or powers are the tuned frequencies or powers utilized to process the last substrate processed within the processing chamber 100. The memory 155 may be solid state memory, such as DRAM, or other suitable type of memory. The memory 155 is communicatively coupled to circuitry of the tuning controller 153. The circuitry of the tuning controller 153 is operable to control the tuning of the matching circuit 124, as further discussed below. A control link 204 (shown in FIG. 2) is utilized to couple the tuning controller 153 to the RF power generators 184, 125 and the matching network 124. Details regarding the operation of the tuning system 152 will be described below. The tuning controller 153 and the memory 155 are embedded in the tuning system 152 so as to allow an internal connection (e.g., within an enclosure of the tuning system 152) among the tuning controller 153, the matching network 124 and the RF power generators 184, 125. Alternatively, the tuning controller 153 and the memory 155 may be externally coupled to the matching network 124 and the RF power generators 184, 125 as needed.

The RF power generators 184, 125 are generally capable of producing an RF signal having a frequency of from about 50 kHz to about 200 MHz and a power between about 0 Watts and about 20,000 Watts.

During operation, the substrate 190 is disposed on the electro-static chuck (ESC) 122 in the plasma processing chamber 100. A process gas and/or gas mixture is introduced into the chamber body 105 from the gas panel 160.

Additionally, a power supply 150 may provide a chucking voltage of about 200 volts to about 2000 volts to an electrode 151. The power supply 150 may also include a system controller for controlling the operation of the electrode 151 by directing a DC current to the electrode 151 for chucking and de-chucking the substrate 190.

The ESC 122 has an isolator 128 for the purpose of making the sidewall of the ESC 122 less attractive to the plasma to prolong the maintenance life cycle of the ESC 122. Additionally, the substrate support pedestal 135 may have a cathode liner 136 to protect the sidewalls of the substrate support pedestal 135 from the plasma gases and to extend the time between maintenance of the processing chamber 100.

The ESC 122 may include heaters disposed therein and connected to a power source (not shown), for heating the substrate, while a cooling base 129 supporting the ESC 122 may include conduits for circulating a heat transfer fluid to maintain a temperature of the ESC 122 and the substrate 190 disposed thereon. The ESC 122 is configured to perform in the temperature range required by the thermal budget of the device being fabricated on the substrate 190. For example, the ESC 122 may be configured to maintain the substrate 190 at a temperature of about minus 150 degrees Celsius to about 500 degrees Celsius for certain embodiments.

The cooling base 129 is provided to assist in controlling the temperature of the substrate 190. To mitigate process drift and time, the temperature of the substrate 190 may be maintained substantially constant by the cooling base 129 throughout the time the substrate 190 is in the processing chamber 100. In one embodiment, the temperature of the substrate 190 is maintained throughout subsequent etch processes at about 70 to 90 degrees Celsius.

A cover ring 130 is disposed on the ESC 122 and along the periphery of the substrate support pedestal 135. The cover ring 130 is configured to confine etching gases to a desired portion of the exposed top surface of the substrate 190, while shielding the top surface of the substrate support pedestal 135 from the plasma environment inside the processing chamber 100. Lift pins (not shown) are selectively moved through the substrate support pedestal 135 to lift the substrate 190 above the substrate support pedestal 135 to facilitate access to the substrate 190 by a transfer robot (not shown) or other suitable transfer mechanism.

The controller 165 may be utilized to control the process sequence, regulating the gas flows from the gas panel 160 into the processing chamber 100 and other process parameters. Software routines, when executed by the CPU, transform the CPU into a specific purpose computer (controller) that controls the processing chamber 100 such that the processes are performed in accordance with the present invention. The software routines may also be stored and/or executed by a second controller (not shown) that is collocated with the processing chamber 100. The system controller 165 may also be in electrical communication with the tuning controller 153 through a cable line 157 to provide information, such as recipe settings, pulsing information (either in digital or analog form), or other relevant information for tuning the frequency and the power from the RF power generators 184, 125 and the matching network 124 through another cable line as needed.

The substrate 190 has various film layers disposed thereon which may include at least one metal layer. The various film layers may require etch recipes which are unique for the different compositions of the other film layers in the substrate 190. Multilevel interconnects that lie at the heart of the VLSI and ULSI technology may require the fabrication of high aspect ratio features, such as vias and other interconnects. Constructing the multilevel interconnects may require one or more etch recipes to form patterns in the various film layers. These recipes may be performed in a single etch processing chamber or across several etch processing chambers. Each etch processing chamber may be configured to etch with one or more of the etch recipes. In one embodiment, processing chamber 300 is configured to at least etch a metal layer to form a conductive structure. For processing parameters provided herein, the processing chamber 300 is configured to process a 300 diameter substrate, i.e., a substrate having a plan area of about 0.0707 $m^2$. The process parameters, such as flow and power, may generally be scaled proportionally with the change in the chamber volume or substrate plan area.

Figure 2:
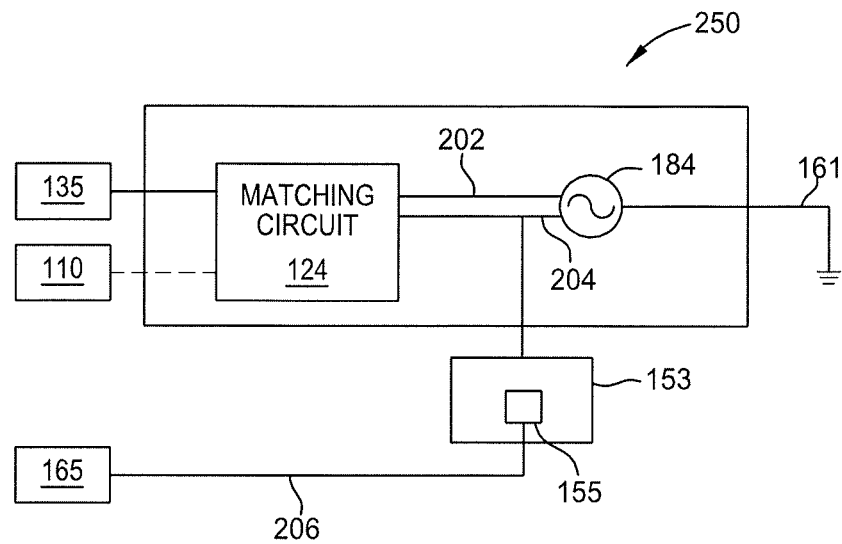
FIG. 2 depicts an exemplary schematic configuration of a tuning controller coupled to a matching network and a generator of the processing chamber of FIG. 1.

FIG. 2 depicts another embodiment of a tuning system 250 coupled to the RF power generator 184 and the matching network 124. In this example, one RF generator 184 is shown in the tuning system 250. The RF generator 184 is coupled to the matching network 124, which further couples to the ESC 122. Additionally or alternatively, the matching network 124 may also be coupled to the showerhead assembly or ceiling (e.g., a chamber lid) as needed for plasma generation. Alternatively, the tuning system 250 may be coupled to the matching network 124 and the showerhead assembly instead. In one embodiment, the tuning system 250 comprises the tuning controller 153 and the memory 155 coupled externally to the RF generator 184 and the matching network 124. The tuning controller 153 and the memory 155 are coupled to the RF generator 184 and the matching network 124 through a control link 204 connected therebetween. The control link 204 couples an output of the RF generator 184 to an input of the tuning controller 153. The control link 204 also couples an output the tuning controller 153 to an input of the matching network 124. The control link 204 may transmit the signals, data or information between the tuning controller 153 and the memory 155, the RF generator 184 and the matching network 124 to facilitate tuning of the match network 124 controlling power provided to the substrate support pedestal 135. A cable line 202 coupled between the RF generator 184 and the matching network 124 may further be coupled to the system controller 165 so as to transmit information, such as recipe settings, pulsing information (either in digital or analog form), or other relevant information for tuning the frequency and the power from the RF power generators 184 and the matching network 124 independent from the tuning controller 153 and the memory 155.

Figure 3A:
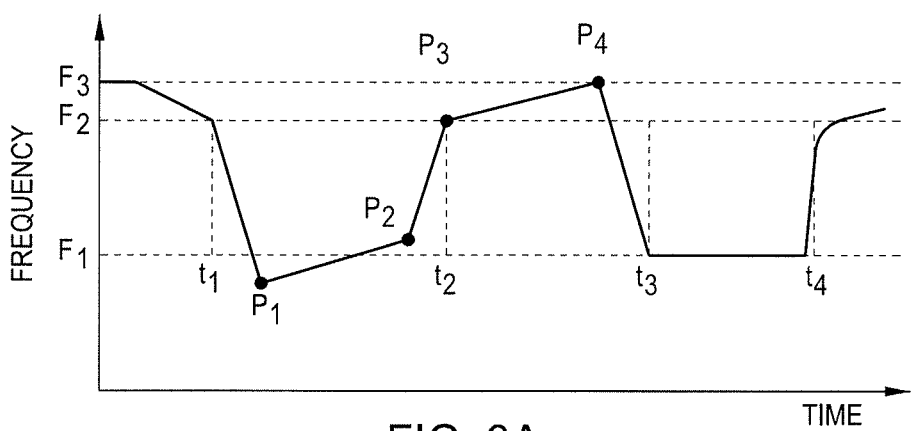
FIG. 3A depicts a graph showing a frequency level over time prior to a tuning process.
Figure 3B:
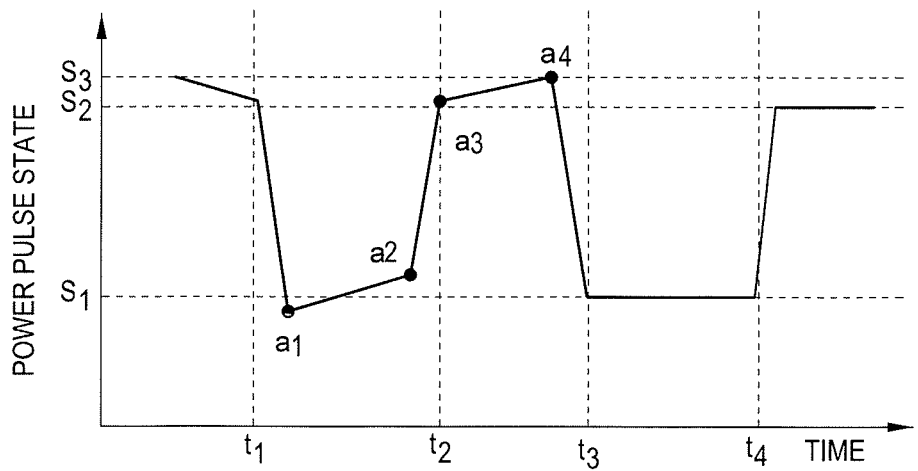
FIG. 3B depicts a graph showing a power level over time prior to a tuning process.

FIGS. 3A and 3B depicts graphs showing frequency and power level over time prior to and after a tuning process respectively. The tuning process as described herein may be utilized in conjunction with any type of process chamber utilizing RF power having a variable frequency and dual level pulsing provided by RF power generators, for example, such as the process chamber 100 and RF power generators 142, 184 or 125 described with respect to FIG. 1.

During processing, the RF power generators 142, 184 or 125 provides two different, non-zero frequency and pulsed power levels, such as a desired high power level state S2 and a low power level state S1, as depicted in FIG. 3B and two frequencies F1, F2, as depicted in FIG. 3A. During dual level pulsing, the RF power generators can alternately provide power at the two distinct power levels as programed, S1 and S2, at discrete time intervals, such as t1, t2, t3, t4, with two different two frequencies F1, F2, as shown in FIGS. 3A-3B. The time periods for t1, t2, t3, t4 are typically the same length. However, in some embodiments, the time periods for t1, t2, t3, t4 may be applied for a different length as needed. The length of each time period t1, t2, t3, t4 may be about 10 microseconds to about 1 second.

The tuning controller 153 from the tuning system 152, 250 also tracks two tuning conditions with two frequencies F1, F2 and the power level states S1, S3 depicted in FIGS. 3A and 3B, or impedance from the matching network 124 as needed. The frequency level F1, F2 of the RF power generator, as shown in FIG. 3A, is provided with the power level state S1, S2 of the RF power generator, as shown in FIG. 3B, so that the RF power generator can move to the frequency corresponding to the a high frequency state F2 to a low frequency state F1 or from the low frequency state F1 to the high frequency state F2 as needed. During the pulse state transition of tuning, the RF power generator ramps both the power and the RF frequency from a first state to a second state. Each ramp can be controlled for each state.

Before the tuning process, the power levels S2, S1 may overshoot or undershoot the target value when the RF generator first turns on, as shown in FIG. 3B. For example, the low power pulse value a1 (e.g., target to be at power level of S1) may be undershoot during the time period t1 while the high power pulse value a4 (e.g., target to be at power level of S2) may overshoot to higher pulsed power level of S3 during the time period t2. The duty cycle for each state in a dual level pulsing system is the percent of time that the RF power generator provides power at the particular state as a fraction of the total time under consideration. As such, in embodiments consistent with the present disclosure, the duty cycle for each state may be from about 1% to about 99%. A 50% duty cycle would indicate that each state applied for the same amount of time.

Figure 4A:
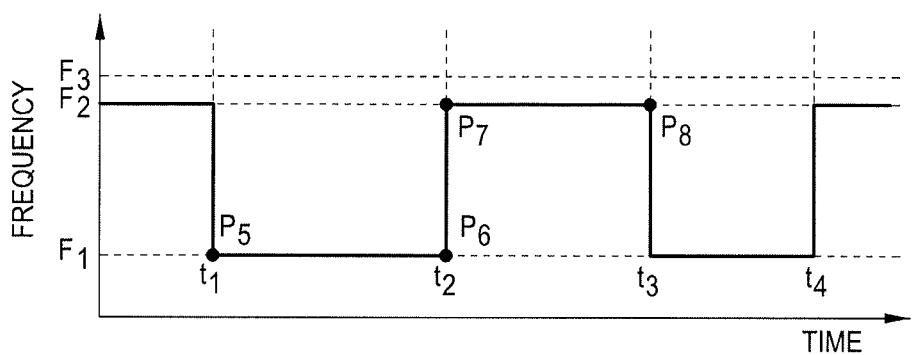
FIG. 4A depicts a graph showing a frequency level over time after a tuning process.
Figure 4B:
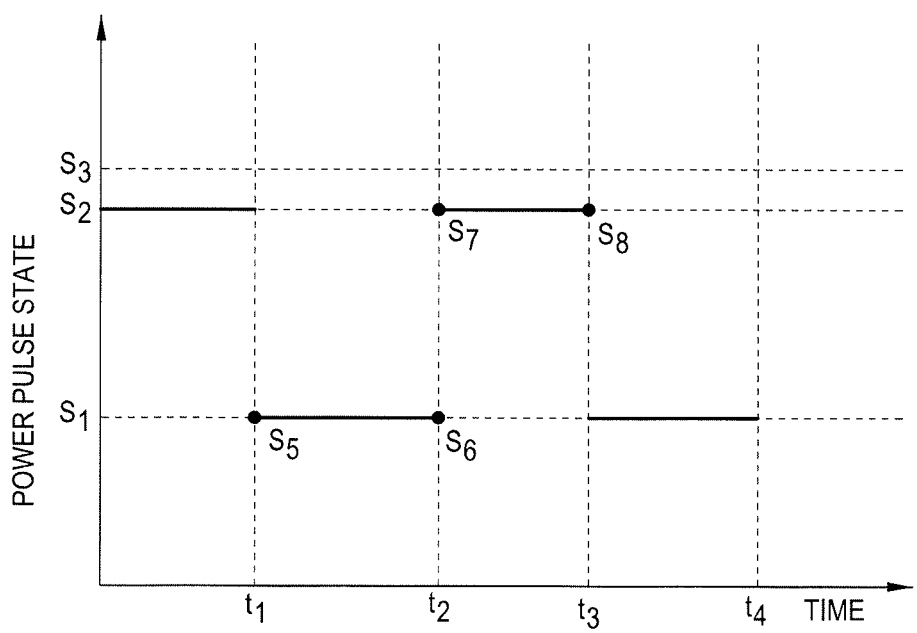
FIG. 4B depicts a graph showing a power level over time after a tuning process.

Correspondingly, the frequency level shown in FIG. 3A may have similar overshoot value P4 or undershoot value P1 at different time periods t1, t2 from the off-target power pulse level. After the tuning process, such as the tuning process 500, 600 depicted in FIGS. 5 and/or 6, each data points, including the power pulse state, frequency level, or matching network impedance are configured to be on target, as shown in FIGS. 4A and 4B correspondingly.

In some embodiments, the power levels of the high pulse power state S2 may be about 5 watts to about 20 kilowatts. Similarly, the power levels of the low pulse power state S1 may also be about 5 watts to about 20 kilowatts. Although described herein as a dual level pulsing between two RF power states, in the embodiments described herein, the levels of RF power provided may be more than two different power states (i.e., a multi-level pulsed power provided to the process chamber). For an N-level pulsed power, a pulse frequency and (N−1) duty cycles, or N ON-times would be used.

Below depicts a table illustrating different combinations of variables that may be altered for tuning the frequency and/or power pulse level of the RF generators. In the below table, "F" stands for frequency tuning only. "M" stands for matching tuning only. "MF" stands for a combination of frequency and matching tuning. Each pulse state may control a particular RF frequency or matching level.

|  | 1 | 2 | 3 | 4 | 5 | 6 | 7 | 8 | 9 |
|---|---|---|---|---|---|---|---|---|---|
| Pulse State 1 | M | M | F | F | MF | MF | MF | M | F |
| Pulse State 2 | M | F | M | F | M | F | MF | MF | MF |

By utilizing the table above, a particular state of matching, frequency or combinations thereof may be tested so as to assist tuning the performance of the RF power generator accuracy for certain frequency or power pulses. In some embodiments, when the continuous power is utilized, the pulse state 1 may be the same as pulse state 2 in the table shown above. Different combinations of the pulse states may be utilized for tuning to achieve tuning both pulse states simultaneously. In some embodiments, when a single level pulsing is utilized, one of the pulse states may be zero (such as the pulse state 1=0 or the pulse state 2=0).

Figure 5:
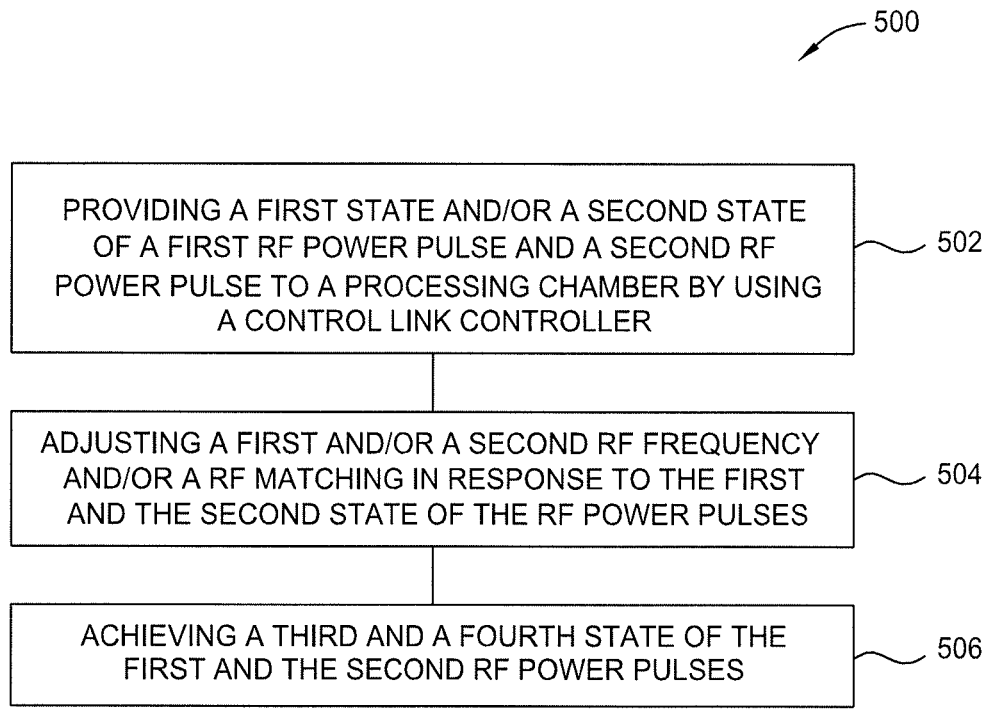
FIG. 5 depicts a flow diagram of one example for performing a tuning process.

FIG. 5 depicts a flow diagram of one example for performing a tuning process 500. The tuning process 500 starts at operation 502 where a first and a second power level (e.g., two pulse states) of RF pulsed powers are provided to the process chamber by one or more RF power generators, such as one or more RF generators 142, 184, 125. The first and the second RF power levels are two different pulse power states S1, S2 of a dual level pulsed power provided to the process chamber, as shown in FIG. 3B. A first and a second frequency associated with the first and the second power pulse states are obtained, as shown in FIG. 3A. In some embodiments, the first and/or second frequency may have been stored as the last known tuned frequency at the first or second RF pulse power or vice versa.

Thus, in order to provide a power/frequency or matching tuning, the tuning controller, such as the tuning controller 153 form the tuning system 152, 250 is provided with the power that achieved a desired impedance at the target pulsed RF power level between the RF power generator and a load (e.g., the plasma) with a tuned or fixed frequency. An estimated or default value may be used as the initial power level for the first time period. The default initial power level set may depend in the chamber design.

At operation 504, the overshoot power pulse value a4 is adjusted to a target high power pulse state S2 while the undershoot power pulse value a1 is adjusted to a target lower power pulse state S1 to achieve a new tuned state (i.e., achieve a desired impedance at the first pulsed RF power between the RF power source and a load), as shown in FIG. 4B. The tuning system 152, 250 may perform additional matching network tuning to achieve the desired impedance match between the RF power generator and a load. Similarly, the system controller 165 may provide information, such as recipe settings, pulsing information (either in digital or analog form), or other relevant information, to assist tuning the pulse power level based on different variables input to the tuning controller 153 in the tuning system 152, 250. The variables used to detect the power pulse level may be input from the tuning controller 153 or from the system controller 165 as needed. After the graph (e.g., data points or power level) is obtained, an adjustment of the pulsed power levels may be performed to reduce a reflected power or other electrical performance from the RF power generators to achieve a new tuned state of the processing chamber 100. The reflected power is typically reduced to a target of about 0% of a forward power provided by the RF power generator to achieve a tuned state. In some embodiments, an allowable band of reflected power may be considered a tuned state depending on the chamber design.

Furthermore, similarly, in the example depicted in FIG. 3A, the frequency may be adjusted to the new tuned state using the tuning controller 153 in the tuning system 152, 250 at the high pulse power state or low pulse power state as needed. When a state of frequency tuning, the starting point for a given state is equal to the last value of the same state. After the frequency tuning, the frequency may maintained at a desired level at a desired time period, as shown in FIG. 4B.

At operation 506, after the desired parameters, such as the two pulsed power states, frequency and/or the matching ratio, are tuned, the two tuned values are stored at the memory 155 in the tuning system 152, 250 or the memory in the system controller 165 as the last known tuned frequency/power to be used the next time the RF power generator provide power or frequency at different pulse power states. As used herein, storing the dual frequency or dual pulsed power level includes storing information associated with the frequency, such as for example, storing a magnitude of the frequency in association with the corresponding power level. The last known tuned frequency at the different power levels may be stored by the memory 155 in the tuning system 152, 250 or the memory in the system controller 165.

Thus, after the tuning process, the dual pulsed power states and the frequencies may achieve a new tuned state (i.e., achieve a desired impedance at the desired pulsed RF power between the RF power generator and a load), as shown in FIGS. 4A and 4B.

Figure 6:
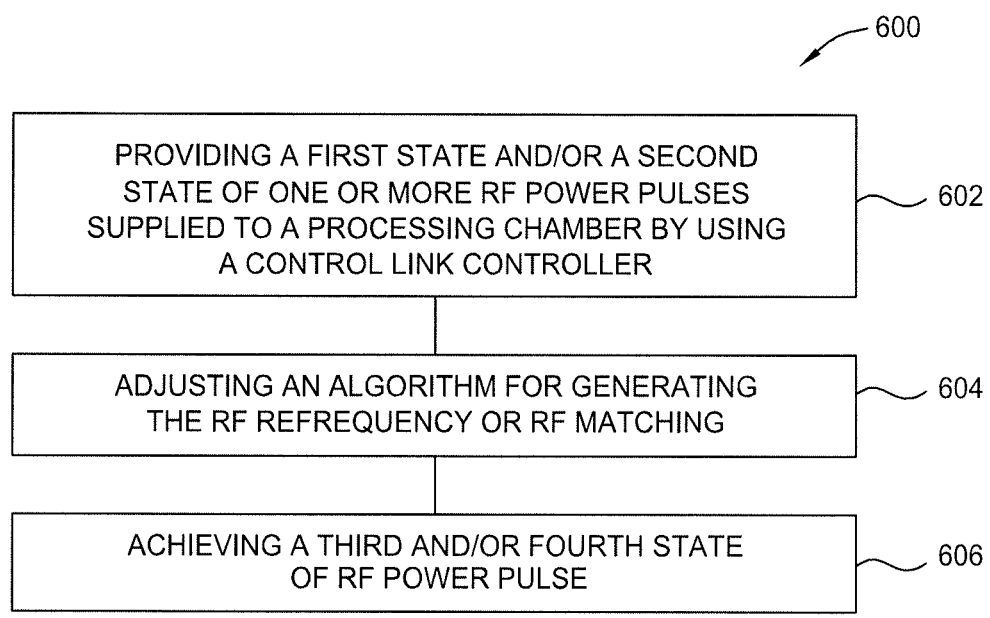
FIG. 6 depicts a flow diagram of another example for performing a tuning process.

FIG. 6 depicts a flow diagram of one example for performing a tuning process 600. Similar to the process 500 depicted in FIG. 5, the tuning process 600 starts at operation 602 where a first and/or a second power level (e.g., dual pulse states) of RF pulsed powers is provided to the process chamber by an RF power generator, such as RF generator 142, 184, 125. The first and second RF pulsed power levels are one of two different power states S1, S2 of a dual level pulsed power provided to the process chamber, as shown in FIG. 3B. The power of state as supplied is similar to the operation 502 depicted in FIG. 5.

At operation 604, similar to the operation 504, the overshoot power pulse value a4 is adjusted to a target high power pulse state S2 while the undershoot power pulse value a1 is adjusted to a target lower power pulse state S1 to achieve a new tuned state.

However, instead of adjusting to achieve desired impedance at the different pulsed RF powers at operation 504, at operation 604, an algorithm or a software program from the tuning controller 153 stored from the memory 155 or the system controller 165 may be adjusted or altered. By altering the algorithm or the software program, the calculation and measurement of the pulsed power level or the frequency level may be re-computed so as to reset the measured value to desired default values. Furthermore, different software programs or algorithms may be pre-saved in the memory 155 from the tuning controller 153 or in the system controller 165. By doing so, based on the detected and/measured data points, a proper and suitable pre-saved software programs or algorithms may be selected to match the performance of the pulsed RF powers and frequency levels. In some examples, the algorithm or the software program may be recalibrated or reprogramed as needed to reset detected data points to the desired default value as needed.

At operation 606, similar to the operation 506, after the desired parameters, such as the pulse power levels/states, frequency and/or the matching ratio, are tuned, the tuned values are stored at the memory 155 in the tuning system 152, 250 or the memory in the system controller 165 as the last known tuned frequency/power to be used the next time the RF power generator provide power or frequency at different pulse power states. As used herein, storing the frequency or pulse power level includes storing information associated with the frequency, such as for example, storing a magnitude of the frequency in association with the corresponding power level. The last known tuned frequency at the different power levels may be stored by the memory 155 in the tuning system 152, 250 or in the system controller 165.

Thus, after the tuning process, the pulse power levels and the frequencies may achieve a new tuned state (i.e., achieve a desired impedance at the desired pulsed RF power) between the RF power generators and a load.

The tuning process 500 and 600 depicted in FIGS. 5-6 may be utilized in conjunction with any type of process chamber utilizing bias power having single or multiple frequencies under single or dual pulse states. Exemplary process chambers include any process chamber used for etching processes, for example, such as the ADVANTEDGE® or Sym3® other process chambers, available from Applied Materials, Inc. of Santa Clara, Calif. Other process chambers, including those from other manufactures, may similarly be used.

Thus, embodiments for the present disclosure include tuning methods and apparatus for operating a plasma enhanced substrate processing system using dual level pulsed radio frequency (RF) power. More specifically, a tuning system having a tuning controller is coupled either internally or externally to a matching network and/or a RF power generator. The tuning controller coupled to the matching network and/or the RF power generator is in direct communication with the RF power generator and the matching network so as to adjust the single or dual pulse power states and the RF frequency in a timely fashion to minimize power reflected back to the RF power source from the plasma and maximize efficient coupling of power from the RF power source to the plasma.

While the foregoing is directed to embodiments of the present invention, other and further embodiments of the invention may be devised without departing from the basic scope thereof, and the scope thereof is determined by the claims that follow:

What is claimed is:

1. A tuning system comprising:
a tuning controller configured to simultaneously track tuning conditions of two pulse states of a dual level RF pulsing data from an RF power generator, each tuning condition comprising a frequency and a power state, by simultaneously adjusting the RF power generator and a matching network, the tuning system having an input configured to receive signals from the RF power generator and an output configured to provide signals to the matching network operable to control power provided to a plasma processing chamber, the tuning controller further configured to tune the matching-network for each of the two pulse states; and
a memory communicatively coupled to the tuning controller, wherein the tuning controller is configured to utilized information received from the memory to control operation of the matching network and the RF power generator.

2. The tuning system of claim 1, wherein the tuning controller is coupled between the RF power generator and the matching network.

3. The tuning system of claim 1, wherein the tuning system is disposed external to the plasma processing chamber.

4. The tuning system of claim 1, wherein the dual level RF pulsing data comprises at least a pulsed power level or a pulsed frequency level from the RF power generator.

5. The tuning system of claim 1, wherein the tuning system is configured to further connect to a system controller of the plasma processing chamber.

6. The tuning system of claim 5, wherein the system controller is configured to provide a predetermined pulsed power level or frequency to the RF power generator.

7. The tuning system of claim 6, wherein at least one of a last known tuned frequency or a last known tuned power level is saved in the system controller.

8. The tuning system of claim 1, wherein at least one of a last known tuned frequency or a last known tuned power level is saved in the memory in the tuning system.

9. The tuning system of claim 8, wherein frequency magnitude of the last known tuned frequency is saved in the memory in the tuning system.

10. The tuning system of claim 1, wherein the tuning controller is configured to adjust an algorithm or software program saved in the memory of the tuning system.

11. The tuning system of claim 1, wherein the tuning controller is configured to adjust impedance from the RF power generator.

12. The tuning system of claim 1, the tuning controller further configured to simultaneously track tuning conditions of a third pulse state of a three-level RF pulsing data from the RF power generator, each tuning condition comprising a frequency and a power state, by simultaneously adjusting the RF power generator and the matching network, the tuning system having an input configured to receive signals from the RF power generator and an output configured to provide signals to a the matching network operable to control power provided to a plasma processing chamber, the tuning controller further configured to tune the matching network for each of the three pulse states.

13. The tuning system of claim 1, further comprising a system controller, a processing chamber having a lid assembly, an antenna electrically coupled to a processing volume of the processing chamber, and a substrate support, wherein the substrate support and the system controller are is coupled to the tuning system.

14. The tuning system of claim 13, further comprising a second match circuit and an antenna power supply generator coupled to the antenna and the system controller.

15. The tuning system of claim 14, further comprising a nozzle positioned in the processing volume, coupled to at least one gas source via a gas line, the gas line positioned between at least two elements of the antenna.

16. The tuning system of claim 15, wherein the at least one gas source is configured to provide one of a hydrocarbon containing gas, a noble gas, a chlorine containing gas, a fluorine containing gas, an oxygen containing gas, a hydrogen containing gas, and nitrogen.

17. The tuning system of claim 16, wherein the hydrocarbon containing gas comprises one of methane, sulfur hexafluoride, carbon tetrafluoride, and hydrogen bromide.

18. The tuning system of claim 13, wherein the tuning controller is further coupled to the lid assembly.

19. The tuning system of claim 18, the lid assembly comprising a lid of a processing chamber and a nozzle.

20. The tuning system of claim 13, further comprising a cable line coupling the matching network, RF generator and system controller.

* * * * *